(12) United States Patent
Farooq et al.

(10) Patent No.: US 7,566,637 B2
(45) Date of Patent: Jul. 28, 2009

(54) METHOD OF INHIBITION OF METAL DIFFUSION ARISING FROM LASER DICING

(75) Inventors: Mukta G Farooq, Hopewell Junction, NY (US); Robert Hannon, Wappingers Falls, NY (US); Dae-Young Jung, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 60 days.

(21) Appl. No.: 11/955,484

(22) Filed: Dec. 13, 2007

(65) Prior Publication Data

US 2009/0155983 A1 Jun. 18, 2009

(51) Int. Cl.
*H01L 21/304* (2006.01)
(52) U.S. Cl. .................. 438/462; 257/E21.238
(58) Field of Classification Search .......... 438/460, 438/462; 257/E21.238
See application file for complete search history.

(56) References Cited

U.S. PATENT DOCUMENTS

| | | | |
|---|---|---|---|
| 5,024,970 A | 6/1991 | Mori | |
| 5,597,766 A | 1/1997 | Neppl | |
| 6,436,808 B1 | 8/2002 | Ngo et al. | |
| 6,797,627 B1 | 9/2004 | Shih et al. | |
| 6,803,295 B2 * | 10/2004 | Rost et al. | 438/462 |
| 7,339,273 B2 * | 3/2008 | Kameyama et al. | 257/774 |
| 2004/0129938 A1 | 7/2004 | Landers et al. | |
| 2004/0150012 A1 | 8/2004 | Jin et al. | |
| 2006/0063379 A1 | 3/2006 | Dory et al. | |
| 2006/0281224 A1 | 12/2006 | Edelstein et al. | |

* cited by examiner

*Primary Examiner*—W. David Coleman
(74) *Attorney, Agent, or Firm*—Gibb & Rahman, LLC; Joseph Petrokaitis, Esq.

(57) ABSTRACT

Method of inhibiting metal diffusion arising from laser dicing is provided. The method includes dividing a wafer into at least one chip. The chip includes internal metallic features. The dividing deposits at least one metallic substance on the outer surface of the chip. After so dividing the chip, the method exposes the chip to a heated ambient environment having a given pressure (e.g., less than one atmosphere). The environment includes a chemical agent capable of bonding with the metallic substance. Additionally, wet chemical etch may be performed on the chip.

1 Claim, 2 Drawing Sheets

METHOD OF INHIBITION OF METAL DIFFUSION ARISING FROM LASER DICING

FIELD OF THE INVENTION

The embodiments herein generally relate to dicing of wafers into chips and more particularly to a process that bonds free metals left on the exterior of the chips to corresponding chemistries to create molecules that are incapable of diffusing back into the interior of the chip, which prevents unwanted metal contamination of the interior of the chip.

BACKGROUND OF THE INVENTION

Preliminary laser dicing is often used in the die singulation process (process of dividing a wafer into single, individual chips) to prevent large initial flaws (that can develop into cracks) at the edges of the chips. Typical dicing methods involve these initial laser cuts followed by final saw cuts. However, in sensitive or high stress chips, even laser dicing as described above may not suffice and may result in initial flaws that are beyond a critical size. If an initial flaw turns into a crack, it can propagate into the chip. Chip package interaction (CPI) stresses arising out of the thermal expansion mismatch between chip and package can result in catastrophic failures during thermal cycling. Typically, these may be manifest as delamination of layers within the chip at the back end of the processing line (BEOL). Further some chip dicing processes can leave metals on the exterior of the chips.

SUMMARY OF THE INVENTION

Disclosed herein is a method embodiment that divides a wafer into at least one chip. The chip includes internal metallic features, and the dividing deposits at least one metallic substance on a surface of the chip. After the dividing, the method exposes the chip to a heated ambient environment having a certain partial pressure of a gaseous chemical agent. The chemical agent is capable of bonding with the metallic substance. The method then removes the chip from the environment.

Also disclosed herein is another method that divides a wafer into at least one chip. The chip again includes internal metallic features, and the dividing deposits at least one metallic substance on a surface of the chip. After the dividing, the method exposes the chip to a heated ambient environment having a certain partial pressure of a gaseous chemical agent. The chemical agent is capable of bonding with the metallic substance. The method then performs a wet chemical etch on the chip.

Disclosed herein is an additional embodiment that divides a wafer into at least one chip. The chip includes internal metallic features, and the dividing deposits at least one metallic substance on a surface of the chip. The metallic substance comprises one of Copper, Aluminum, and Tungsten. After the dividing, the method exposes the chip to a heated ambient environment having a certain partial pressure of a gaseous chemical agent. The chemical agent is capable of bonding with the metallic substance. The method then performs a wet chemical etch on the chip.

BRIEF DESCRIPTION OF THE DRAWINGS

These, and other, aspects and objects of the present invention will be better appreciated and understood when considered in conjunction with the following description and the accompanying drawings in which.

DETAILED DESCRIPTION OF EMBODIMENTS OF THE INVENTION

Figure 2:
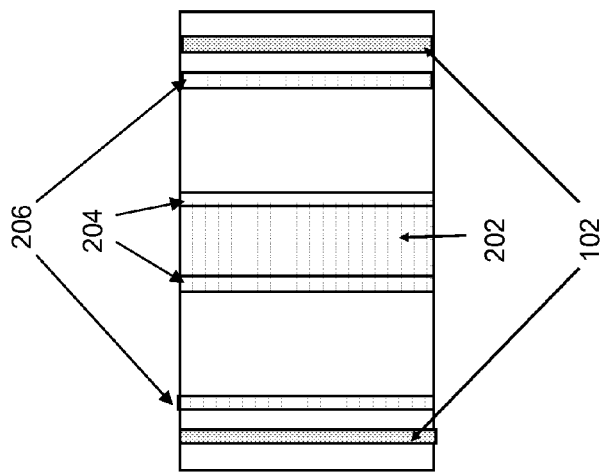
FIG. 2 is a schematic top-view diagram of an integrated circuit chip.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As mentioned above, preliminary laser dicing is often used in the process of dividing a wafer into individual chips to prevent initial flaws (that can develop into cracks). The cracks can cause delamination of layers within the chip BEOL. One improvement for such laser-assisted wafer dicing (that is designed to reduce the potential energy of the initial crack) utilizes a crack-stop trench 102 that is shown in FIGS. 1-3.

Figure 1:
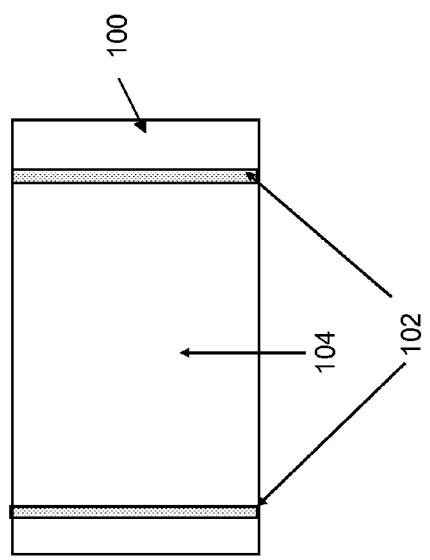
FIG. 1 is a schematic top-view diagram of an integrated circuit chip.

More specifically, as shown in top view in FIG. 1, the crack-stop trench 102 is patterned into the chip 100 to a sufficient depth and filled with a material of sufficient durability that cracks progressing from the exterior of the chip will not penetrate beyond the crack-stop layer into the interior of the chip. Details regarding the operation, creation, materials, processing conditions and other details of crack-stop layers within diced integrated circuit chips is discussed in detail in U.S. Patent Publication number 2004/0129938 (incorporated herein by reference) and such details are not included herein to focus the reader on the salient aspects of the invention.

Figure 3:
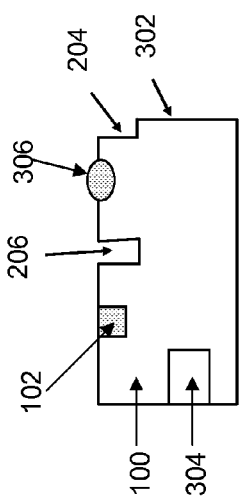
FIG. 3 is a schematic cross-sectional view diagram of an integrated circuit chip.

After the crack-stop trench 102 is formed, as shown in FIG. 2, a laser scribe 204 (trench formed by laser) can be formed before the saw blade cuts the wafer into chips (which removes the saw blade region 202). Details regarding the creation and processing conditions and other details of laser trench use within diced integrated circuit chips is discussed in detail in U.S. Patent Publication number 2006/0281224 (incorporated herein by reference) and such details are not included herein to focus the reader on the salient aspects of the invention.

An additional improvement is the formation of a second laser formed trench 206 that is between the first laser scribe 204 and the crack-stop trench 102, as shown in the top view in FIG. 2. The additional laser trench 206 can be very close to a crack-stop trench 102 (e.g., can be only a few microns (10 to 20 um) from the crack-stop 102. FIG. 3 also illustrates the same structure in cross-sectional view after the saw blade cut has been performed, and item 302 illustrates the edge of the chip 100 formed by the saw blade cut.

These laser trenches 204, 206 reduce the "run path" for the initial crack, which results in structures that are less prone to failure. However, depending on where the additional laser cuts are taken (especially trench 206) certain metallic features (Copper, Aluminum, Tungsten etc.) within the integrated circuit may be subjected to the energetic laser beam. The laser beam can cause instantaneous melting and/or vaporization of the metallic features in the affected areas, mixing of the molten or vaporized metals with other materials in the affected areas, and potential diffusion of any unattached metal atoms into the internal circuitry 304 of the chip 100.

Item 306 in FIG. 3 represents a loose metallic particle that, if not removed, could migrate (or defuse) toward the internal wiring and/or circuitry 304 of the chip 100, reducing the performance of the chip and potentially making the chip non-operable and defective. Therefore, one feature of embodiments herein is to inhibit and possibly prevent the diffusion of any metal towards the internal circuitry 304 of the chip 100.

Figure 4:
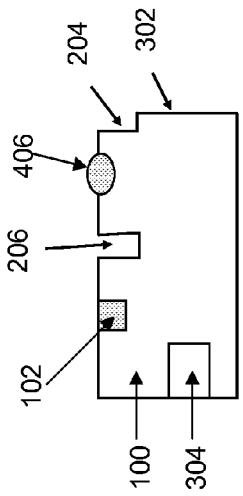
FIG. 4 is a schematic cross-sectional view diagram of an integrated circuit chip.

The metallic deposits 306 are caused by very rapid heating and cooling of metal in the very outer layers of the chip. These metallic deposits 306 can comprise any type of metal that is utilized within the outer layers of the chip 100 including, copper, aluminum, tungsten, etc. The solutions presented herein ensure that all metal atoms are attached (bonded) to some other chemical that prevents them from diffusing into the chip. This bonding of the metallic material ties up the metal in a molecule (illustrated as item 406 in FIG. 4) and prevents its diffusion. This process creates stable molecules that will not dissociate in the presence of the thermal or chemical exposures that can occur in subsequent chip assembly processes or field conditions.

Figure 5:
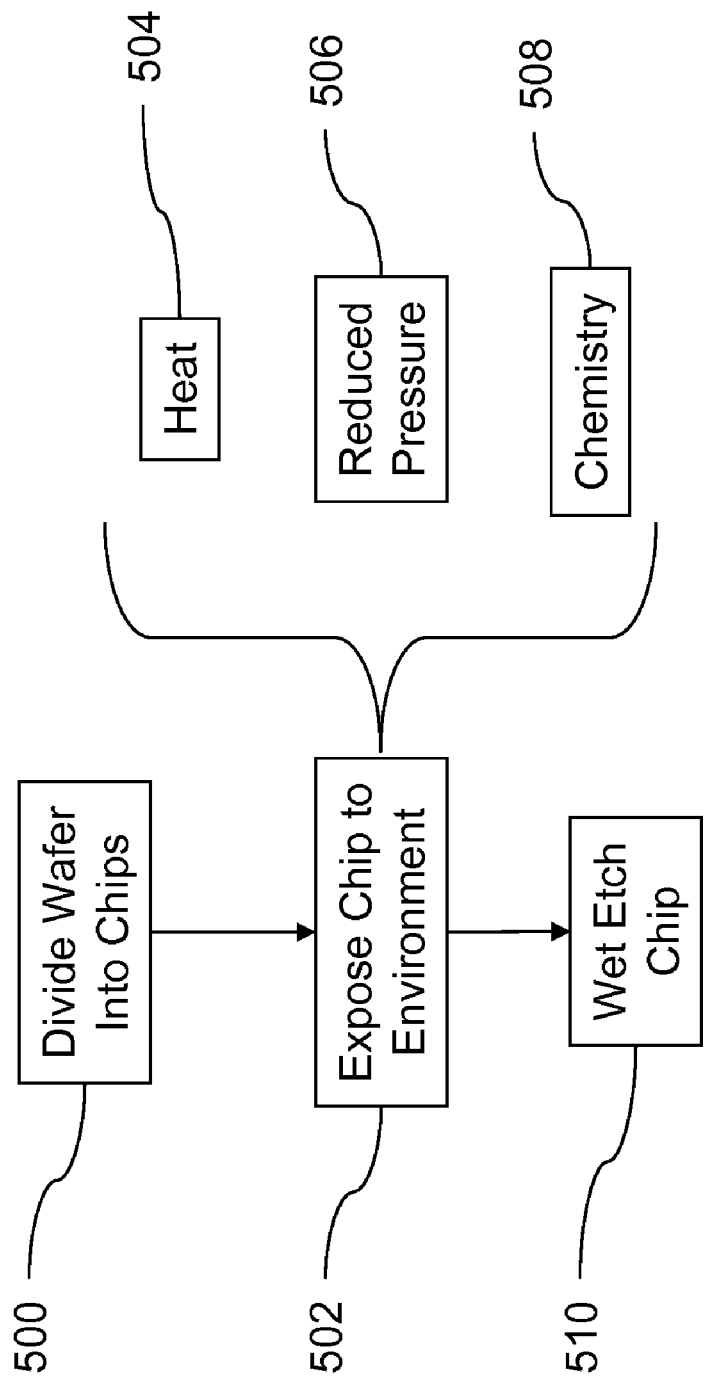
FIG. 5 is a flow diagram illustrating a preferred method of the invention.

As shown in flowchart form in FIG. 5, embodiments herein provide a method that begins by dividing a previously processed wafer into at least one chip (500). Because the wafer was previously processed, it includes internal metallic features, such as wiring, power devices, storage devices, logical devices, etc. As mentioned above, the process of dividing the wafer into chips can deposit at least one metallic substance 306 on the outer surface of the chip. Again, such metallic substances can diffuse into the internal circuitry and structures of the chip and reduce the performance of or damage the chip.

After so dividing the chip, the process exposes the chip to a heated ambient environment having a given pressure (e.g., less than one atmosphere). The environment comprises a chemical agent capable of bonding with the metallic substance. The environmental conditions discussed herein can be created by those ordinarily skilled in the art using/common vacuum/pressure chambers, common heating elements, and common chemical dispensers. The details of such devices are not discussed herein to focus the reader on the salient aspects of the invention. Therefore, item 502 in the flowchart shown in FIG. 5 illustrates exposing the chip to the environment which is controlled according to the following variables: heat (504); reduced pressure (506); and chemistry (508).

The exposing process in item 502 controls the environment so as to bond a chemical substance to the metallic substance to create a molecule 406 that is incapable of diffusing to the interior of the chip. For example, by bonding various chemistries to the exposed metal 306 on the chip, the molecules 406 that are formed are sufficiently large or have sufficient chemical properties (attachment properties) that the molecules 406 cannot diffuse through the outer portions of the chip (e.g., through the insulators or silicon layers of the chip). Thus, after formation, the molecule 406 is permanently positioned on and attached to the exterior of the chip 100 throughout the useful life of the chip.

Thus, the embodiments herein send the singulated chips through an ambient, such as an oxidizing ambient. The exposing of the chip to the environment is performed at a temperature above the temperature at which the dividing of the chip is performed (e.g., above room temperature); at a given pressure (e.g., lower than 1 atmosphere); and for a predetermined time period. Thus, annealing could occur at temperatures of, for example, 100° C., 200° C., 300° C., etc. for a pre-determined time (e.g. ½ hour, 1 hour, 2 hours, 3 hours, etc.) in an atmosphere with a partial pressure of oxygen equal to or greater than, for example, 10E-24 (or any amount below 1 atmosphere). In addition, some embodiments could operate at 1 atmosphere, or at pressures above 1 atmosphere. Those ordinarily skilled in the art would understand that the temperatures, times, pressures, chemistries, ambients, etc. discussed herein can be changed depending upon the metal 306 involved, the type of molecules 406 that are desired to be formed, the material of the outer layers of the chip, as well as many other functional parameters. Thus, the foregoing temperatures, pressures, etc. are merely examples, and the invention is not limited to these examples. Therefore, if the annealing temperature is raised or lowered, the minimum oxygen partial pressure needed for oxidation can be determined from, for example, Ellingham Diagrams. Other compound formations (e.g. sulfide, chloride, hydride, nitride, etc) may similarly be achieved by an appropriate combination of chemical concentration (sulfur, chlorine, hydrogen, nitrogen etc.), pressure, and temperature.

Additionally, as shown in item 510, a wet chemical etch can be performed on the chip. The wet chemical etch comprises chemistry capable of dissolving the metallic substance 306, allowing the metallic substance 306 to be removed from the outer layer of the chip 100. Therefore the embodiments herein can also remove all free metal atoms by chemical and/or physical means. Thus, the embodiments herein can send the singulated chips through a wet chemical etch which selectively removes all unattached metallic particles. For example, Copper readily dissolves in Nitric Acid and Sulfuric Acid in the presence of Oxygen, and is also soluble in Ammonia, Ammonium Carbonate, or Potassium Cyanide solutions in the presence of Oxygen. Aluminum can similarly be passivated by Nitric Acid. Copper and Aluminum may be therefore removed by a Sulphuric Acid or Nitric Acid wet etch. Alternatively, the metallic particles can be partially converted to the corresponding salt (Cu-sulphate or Cu-nitrate) and rinsed from the chip.

The order of processing shown in a flow chart in FIG. 5 does not necessarily need to be performed in the order shown. Therefore, for example, the chemical wet etching process in item 510 can be performed before or after the chip is exposed to the ambient environment in item 502.

Therefore, as shown above, the embodiments herein address the problem that occurs when metallic particles are deposited on the exterior of the chip during wafer dicing processes that utilize laser trenches. The embodiments herein bond various chemicals with the metallic particles to create molecules that will not diffuse into the interior of the chip. In addition, embodiments herein apply a wet etch that removes such metallic particles from the surface of the chip. By doing so, the embodiments herein prevent the metallic particles from contaminating the interior circuitry and devices within the chip. This helps reduce the rate of defects within chips, thereby increasing yield and reliability.

While the invention has been described in terms of preferred embodiments, those skilled in the art will recognize that the invention can be practiced with modification within the spirit and scope of the appended claims. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

What is claimed is:

1. A method comprising:

dividing a wafer into at least one chip, wherein said chip includes internal metallic features, and wherein said dividing deposits at least one metallic substance on a surface of said chip, wherein said metallic substance comprises one of Copper, Aluminum, and Tungsten;

after said dividing, exposing said chip to a heated ambient environment having a certain partial pressure of a gaseous chemical agent, wherein said chemical agent is capable of bonding with said metallic substance; and performing a wet chemical etch on said chip, wherein said chemical agent comprises oxygen, wherein said chemical agent comprises at least one of sulfur, chlorine, nitrogen and hydrogen, wherein said exposing process controls said environment so as to bond said chemical agent to said metallic substance to create a molecule that is incapable of diffusing to an interior of said chip, such that said molecule is permanently bonded to an exterior of said chip throughout a useful life of said chip, wherein said exposing of said chip to said environment is performed for a predetermined time period, wherein said environment comprises a temperature above a temperature at which said dividing is performed, and wherein said wet chemical etch comprises chemistry capable of dissolving said metallic substance.

* * * * *